United States Patent [19]

Kazem-Goudarzi et al.

[11] Patent Number: 5,415,944

[45] Date of Patent: May 16, 1995

[54] SOLDER CLAD SUBSTRATE

[75] Inventors: Vahid Kazem-Goudarzi; Edwin L. Bradley, III, both of Sunrise; Kingshuk Banerji, Plantation; Henry F. Liebman, Tamarac, all of Fla.

[73] Assignee: Motorola, Inc., Schaumburg, Ill.

[21] Appl. No.: 236,615

[22] Filed: May 2, 1994

[51] Int. Cl.⁶ .......................... B22F 7/00; H01L 23/02
[52] U.S. Cl. ..................... 428/567; 428/546; 428/548; 428/553; 428/558; 428/559; 361/760
[58] Field of Search ............ 428/546, 548, 553, 558, 428/559, 647; 228/180.2; 361/760; 420/557

[56] References Cited

U.S. PATENT DOCUMENTS

| | | | |
|---|---|---|---|
| 4,778,733 | 10/1988 | Lubrano et al. | 428/647 |
| 4,967,950 | 11/1990 | Legg et al. | 228/180.2 |
| 5,154,341 | 10/1992 | Melton et al. | 228/180.2 |
| 5,229,070 | 7/1993 | Melton et al. | 420/557 |
| 5,233,504 | 8/1993 | Melton et al. | 361/760 |
| 5,320,272 | 6/1994 | Melton et al. | 228/180.2 |

*Primary Examiner*—Donald P. Walsh
*Assistant Examiner*—John N. Greaves
*Attorney, Agent, or Firm*—Dale W. Dorinski

[57] ABSTRACT

A solder-clad printed circuit board (100) has solder particles of one alloy (120) arranged within a matrix of a second solder alloy (115). This arrangement forms a flat structure that is alloyed to the solder pads (105) on the substrate. The solder particles (120) have a predetermined melting temperature and are made from one or more of the following elements: tin, lead, bismuth, indium, copper, antimony, cadmium, arsenic, aluminum, gallium, gold, silver. The second solder alloy (115) is compositionally distinct from the solder particles, and has a melting temperature that is lower than the melting temperature of the solder particles. The solder particles may comprise about 88% by weight, and the second solder alloy may comprise about 12% by weight of the solder cladding.

9 Claims, 1 Drawing Sheet

SOLDER CLAD SUBSTRATE

CROSS REFERENCE TO RELATED APPLICATIONS

This application is related to U.S. patent application Ser. No. 08/236,611, filed May 2, 1994, entitled "Soldering Process," by Vahid Kazem-Goudarzi, Henry F. Liebman, Kingshuk Banerji, William B. Mullen, III, and Edwin L. Bradley, III, incorporated herein by reference, and to U.S. patent application Ser. No. 08/236,614, filed May 2, 1994, entitled "Multiple Alloy Solder Preform," by William B. Mullen, III, Kingshuk Banerji, Edwin L. Bradley, III, and Vahid Kazem-Goudarzi, both of which are being filed concurrently herewith and both of which are assigned to Motorola, Inc.

TECHNICAL FIELD

This invention relates in general to a solderable substrate and more particularly to a circuit carrying substrate clad with solder having more than one melting temperature.

BACKGROUND

Soft solder is a fusible alloy, typically consisting of tin and lead, which is used for the purpose of joining together two or more metals at temperatures below their melting points. In addition to tin and lead, solders may occasionally contain varying amounts of other materials, such as antimony, bismuth, cadmium, or silver, which are typically added for the purpose of varying the physical properties of the alloy. However, in many solders, some of these elements, notably antimony, are only present as impurities. Solder is widely used in the electronics industry for attaching electrical components to printed circuit boards. Printed circuit boards typically have an electrical conductor pattern consisting of a thin metal sheet, etched to form the pattern. In order to successfully attach the electrical components to the printed circuit board, there must be a metallurgical affinity between the two metals that are going to be soldered together, the metals must be free from all non-metallic surface contamination, there must be complete and adequate metallic contact between the solder and the metals that are to be soldered, and there must be a temperature adequate for sufficient alloying of the metal. The solder provides the attachment by virtue of an intermetallic solution, which takes place at the soldering temperature.

One method of assembling electronic assemblies is by a process known as solder cladding or solid solder deposition. This is done by screen printing and reflowing a solder paste on the solderable surfaces of a printed circuit board (PCB) during the PCB fabrication. The advantage of this method is that the electronic components can then be placed directly on the PCB, without having to print solder paste. One of the disadvantages of this method is that the paste that is clad onto the PCB results in a highly domed surface on the solder pads. The domed surfaces degrade the accuracy of components placement. The parts and flux tend to slide off of the domed surface when they are placed, and while the circuit board is subjected to vibrations moving down the assembly line. Some have attempted to solve this problem by reducing the amount of solder paste dispensed onto the solder pad, thus decreasing the curvature of the domed surface. However, reducing the volume of solder paste decreases the total wetting forces of the solder on the pad and, therefore, reduces the tendency of the components to self center during the assembly reflow operation. This self-centering tendency is extremely important to assure accurate alignment and high-yield soldering. In addition, one would like to maximize the amount of solder deposited on the board during the cladding process in order to create a full solder fillet between the component and the PCB.

Clearly, it would be a benefit to the electronics industry if a method of soldering could be devised that includes the advantages of both solder cladding and solder printing, but avoids the disadvantages of both processes.

SUMMARY OF THE INVENTION

Briefly, according to the invention, an electrically insulating substrate clad with a solderable composition made from two different solder alloys is disclosed. The first solder alloy undergoes a solid-to-liquid transition at a first temperature. The second solder alloy undergoes this solid-to-liquid transition at a second temperature, the second temperature being greater than the first temperature. The soldering composition has particles of the first solder alloy arranged within a matrix of the second solder material to form a solid mass.

In alternate embodiments of the invention, the first solder alloy and the second solder material form a metallurgical bond to each other.

DETAILED DESCRIPTION OF THE PREFERRED EMBODIMENT

Figure 1:
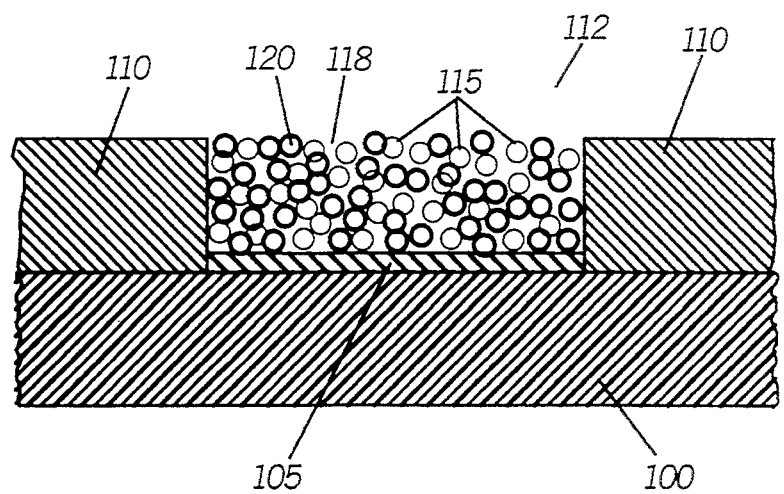
FIG. 1 is a cross sectional view of a circuit carrying substrate prior to heating, in accordance with the invention.

While the specification concludes with claims defining the features of the invention that are regarded as novel, it is believed that the invention will be better understood from a consideration of the following description in conjunction with the drawing figure.

Most solders are alloys of tin and lead. Pure lead melts at 327° C. and pure tin melts at 232° C. When these two metals are mixed, it results in a composition having a lower melting point than either of the individual components. Depending upon the percentage composition of the tin and lead, the melting point will vary. However, there is one alloy having a composition of 63% tin and 37% lead, known as the eutectic composition, that has the lowest melting point (183° C.) of any of the possible mixtures. This eutectic composition has the characteristic of having a sharp and distinct melting point precisely at this temperature. That is, the solder alloy undergoes a phase change from solid to liquid at this point. All other compositions of tin and lead, other than the eutectic, are mixtures which do not melt sharply at any one temperature, but which pass through an intermediate range of plasticity in cooling from the liquid to the solid state. In fact, it is traditional for metallurgical purposes to consider tin-lead solder not as an alloy of tin and lead, but rather as a eutectic alloy plus lead, or a eutectic allow plus tin, as the case may be. Although really a mixture, the eutectic composition possesses the metallurgical properties of a single pure constituent.

These various alloys that pass through an intermediate range of plasticity are said to have a melting range. Above the melting range, the alloy is a liquid. Below the melting range, the alloy is a solid. However, within the melting range, it is a plastic-like material that cannot be defined strictly as a liquid nor as a solid. The lower temperature of the melting range is known as the solidus temperature, and the upper temperature of the melting range is known as the liquidus temperature. At temperatures below the solidus temperature, the allow is a solid, and at temperatures above the liquidus temperature, the alloy is a liquid. Materials other than tin and lead may be added to the alloy and will cause similar types of behavior. Examples of some materials are aluminum, antimony, arsenic, bismuth, cadmium, copper, indium, iron, nickel, silver, and zinc. Because many solder alloys exhibit a melting range rather than a pure melting point, a great deal of confusion exists over exactly what point may be considered to be the melting point of solder. For purposes of this invention, the melting point of a solder is considered to be that point at which the alloy transitions from a solid either to a liquid or to a plastic type composition; that is the melting point may be considered to be equivalent to the lower end of the melting range, or the solidus point.

This invention provides a flat solder surface on the solderable portions of a printed circuit board, and can be used in both single-sided and double-sided printed circuit assemblies. It improves the fluxing and part placement accuracy of automated placement systems. Typically, the manufacturer of the printed circuit board adds the solder to the printed and etched board during the fabrication process. In the preferred embodiment of the invention, a dual alloy solder paste is applied to the solderable surfaces of the printed circuit board. The dual alloy solder paste or soldering composition is made from powders of two different solder alloys. Each of the alloys has a melting point or range that is unique from the other. The metallic portion of the solder paste consists of a mixture of 88% by weight of a tin-lead-silver alloy (melting point 179°–181° C.) and 12% by weight of a tin-lead-bismuth alloy having a melting point of about 144° C. The tin-lead-silver alloy is about 62% tin, 36% lead, and 2% silver, whereas the tin-lead-bismuth alloy is about 43% tin, 43% lead, and 14% bismuth. Each solder alloy is in the form of finely divided particles (such as spheres or irregularly shaped particles), and the mixture of the two alloys is suspended in a matrix of a vehicle and a fluxing agent. The tin-lead-bismuth solder alloy is referred to as the low temperature alloy. Although the preferred embodiment employs two solder alloys, three or more distinct alloys could be mixed, for example, and still be considered to be within the spirit and scope of the invention. In addition, pure forms of metal can be used instead of alloys. In other embodiments, alloys of elements such as tin, lead, bismuth, indium, copper, antimony, cadmium, arsenic, aluminum, gallium, gold, silver may also be used.

Referring now to FIG. 1, a printed circuit board 100 has a solderable surface 105. A mask 110 having appropriately placed openings 112 is placed on the PCB 100 so that the solderable surfaces 105 are exposed. The mask 110 can be temporary, as in the case of stencils or screen meshes, or it can be permanent, as in the case of a polymeric photoresist or solder mask. The dual-alloy solder paste, containing low temperature particles 115 and high temperature particles 120 is deposited in the openings 112. In the preferred embodiment where the soldering composition is a dual alloy solder paste, the method of depositing the paste in the openings is accomplished by printing the paste, as is well known in the art. In other cases, the solder particles 115 and 120 may be deposited in other ways, for example spraying, syringe dispensing, pin transfer, etc. The dual alloy solder paste may have additional components 118 such as fluxes or vehicles that aid in the printing and reflow processes.

Figure 2:
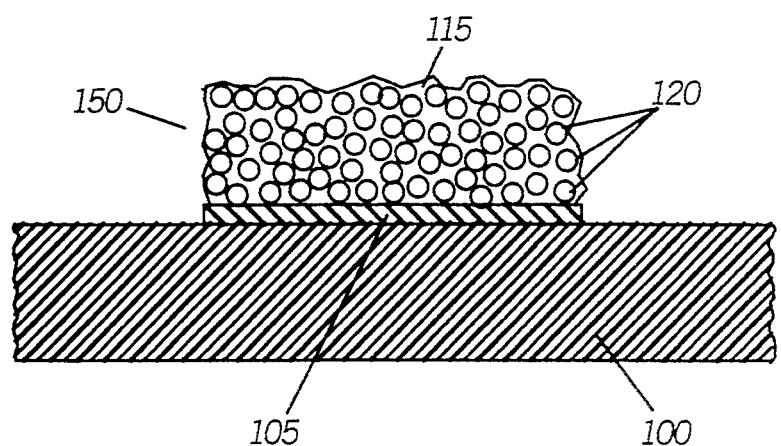
FIG. 2 is a cross sectional view of a circuit carrying substrate after heating, in accordance with the invention.

Referring now to FIG. 2, the dual alloy solder paste is heated to a temperature such that the low temperature solder alloy 115 is melted or liquified, but the high temperature alloy 120 remains in its original and unmelted, solid state. In the preferred embodiment the peak reflow temperature would be 165° C. At this temperature, only the low temperature solder alloy liquefies. The higher temperature solder spheres remain intact and, upon cooling below its melt temperature, the low temperature solder alloy solidifies. This process of partial melting creates a flat, uniform, solid solder surface. Additional operations may be performed on the reflowed circuit board to remove foreign materials, such as flux residue and excess solder balls. This is typically performed by cleaning with aqueous or organic cleaning agents. At this point, the PCB 100 is clad with a thick, but uniform and flat layer of solder 150 on the solder pads 105. This layer of solder 150 consists of an aggregate-like structure of the unreflowed high temperature solder alloy particles 120 distributed within a matrix of the reflowed or melted low temperature solder alloy 115. It is postulated that during the reflow process, the low temperature alloy has alloyed or formed a metallurgical bond to the high temperature solder material, thereby adding to the mechanical integrity of the resulting solder mass. The formation of the metallurgical bond is thought to occur by diffusion between the molten metal alloy and the solid metal during reflow.

The printed circuit boards may now be used in an assembly process similar to that used with conventional clad printed circuit boards; that is, the surface is fluxed, and surface-mount components or parts are placed at the desired locations with the solderable portions of the parts in contact with the reflowed soldering composition on the printed circuit board. The flat surface of the solder pads aids in placing the parts, because the parts do not move about, compared to the domed pads found in the conventional art. In addition, the rough surface of the solder 150 aids in preventing the flux from spreading off of the solder pad. During the final reflow assembly, the temperature is high enough to reflow both the low temperature alloy 115 and the high temperature alloy 120. As the temperature passes above 140° C., the low temperature alloy melts, and as the temperature exceeds 183° C., the high temperature alloy also melts and the two materials form a third alloy upon cooling.

Clearly, it can be seen that this invention provides the advantage of the creation of flat, uniformly rough surfaces on the solderable portions of a printed circuit board due to the presence of unmelted particles of solder in the reflowed low-melting alloy. This creates a surface that is highly suitable for retention of any flux or tacking agent dispensed on the pad, whereas the domed surfaces found in conventional solder clad or reflowed PCBs are prone to flux loss by rolling or flowing off of the domed surfaces. Further, the flat surfaces provided by the invention provide improved quality in placement of the surface mounted components, as the components do not slide off of the flat solder pads. Surface tension provided during the reflow operation also aids in self-centering the part on the pad. While the preferred embodiments of the invention have been illustrated and described, it will be clear that the invention is not so limited. For example, one alternative embodiment is to make flat solder 'bumps' on a semiconductor wafer. Typically, the process of bumping a wafer with solder results in rounded bumps on the solderable pads. By substituting a semiconductor wafer or an integrated circuit substrate in place of the printed circuit board, and by making other appropriate changes in the structure required by the much smaller pad size, solder bumps with a flat surface can be made on a semiconductor substrate. Numerous other modifications, changes, variations, substitutions and equivalents will occur to those skilled in the art without departing from the spirit and scope of the present invention as defined by the appended claims.

We claim:

1. A circuit carrying substrate, comprising:
   an electrically insulating substrate having solderable portions; and
   a soldering composition alloyed to the solderable portions, the soldering composition having first solder particles arranged within a matrix of a second solder material to form a solid mass, the soldering composition comprising:
      particles of a first solder material having a predetermined solidus temperature;
      a second solder material compositionally distinct from the first solder material and having a predetermined liquidus temperature that is less than the predetermined solidus temperature of the first solder material.

2. The circuit carrying substrate of claim 1, wherein the first solder particles comprise about 88% by weight and the second solder material comprises about 12% by weight.

3. The circuit carrying substrate of claim 1, wherein soldering composition forms a substantially planar coating on the solderable portions.

4. The circuit carrying substrate of claim 1, wherein the second solder material is alloyed to the first solder particles.

5. A solder-clad printed circuit board, comprising:
   a printed circuit board having solderable portions;
   a soldering composition on the solderable portions, the soldering composition comprising:
      first solder particles comprising an alloy of 62% tin, 36% lead and 2% silver, and having a melting range of about 179°–181° C.;
      a second solder alloy comprising an alloy of 43% tin, 43% lead and 14% bismuth, and having a melting range of about 144°–163° C.;
      the soldering composition comprising about 88% by weight of the first solder particles and about 12% by weight of the second solder alloy; and
   the soldering composition having the first solder particles arranged within a matrix of the second solder alloy to form a substantially solid, planar coating on the solderable portions.

6. The solder-clad printed circuit board of claim 5, wherein the second solder material is alloyed to the first solder particles.

7. A semiconductor substrate, comprising:
   a semiconductor substrate having solderable portions;
   a soldering composition alloyed to the solderable portions, the soldering composition comprising:
      first solder particles having a predetermined solidus temperature; and
      a second solder material having a predetermined liquidus temperature that is less than the predetermined solidus temperature of the first solder material;
   the soldering composition having the first solder particles arranged within a matrix of the second solder alloy to form a substantially solid, planar coating on the solderable portions.

8. The semiconductor substrate of claim 7, wherein the second solder material is alloyed to the first solder particles.

9. The semiconductor substrate of claim 7, wherein the soldering composition comprises about 88% by weight of the first solder particles and about 12% by weight of the second solder alloy.

* * * * *